United States Patent
Ward et al.

(10) Patent No.: US 9,548,211 B2
(45) Date of Patent: Jan. 17, 2017

(54) METHOD TO SELECTIVELY POLISH SILICON CARBIDE FILMS

(75) Inventors: William Ward, Glen Ellyn, IL (US); Timothy Johns, Naperville, IL (US)

(73) Assignee: Cabot Microelectronics Corporation, Aurora, IL (US)

(*) Notice: Subject to any disclaimer, the term of this patent is extended or adjusted under 35 U.S.C. 154(b) by 0 days.

(21) Appl. No.: 12/630,288

(22) Filed: Dec. 3, 2009

(65) Prior Publication Data

US 2010/0144149 A1 Jun. 10, 2010

Related U.S. Application Data

(60) Provisional application No. 61/200,812, filed on Dec. 4, 2008.

(51) Int. Cl.
| | |
|---|---|
| *H01L 21/302* | (2006.01) |
| *H01L 21/461* | (2006.01) |
| *B44C 1/22* | (2006.01) |
| *C23F 1/00* | (2006.01) |
| *C03C 15/00* | (2006.01) |
| *C03C 25/68* | (2006.01) |
| *H01L 21/3105* | (2006.01) |
| *H01L 21/321* | (2006.01) |
| *C09G 1/02* | (2006.01) |
| *H01L 29/16* | (2006.01) |

(52) U.S. Cl.
CPC .......... *H01L 21/31053* (2013.01); *C09G 1/02* (2013.01); *H01L 21/3212* (2013.01); *H01L 29/1608* (2013.01)

(58) Field of Classification Search
CPC .............................. H01L 21/3212; C09G 1/02

USPC ............................................. 438/693
See application file for complete search history.

(56) References Cited

U.S. PATENT DOCUMENTS

| | | |
|---|---|---|
| 6,544,892 B2 | 4/2003 | Srinivasan et al. |
| 6,689,692 B1 | 2/2004 | Grover et al. |
| 6,995,090 B2 | 2/2006 | Minamihaba et al. |
| 2003/0124850 A1* | 7/2003 | Minamihaba et al. ....... 438/689 |
| 2003/0139069 A1 | 7/2003 | Block et al. |
| 2004/0259745 A1 | 12/2004 | Asher et al. |
| 2005/0181609 A1 | 8/2005 | Kurata et al. |
| 2007/0037892 A1* | 2/2007 | Belov ............................. 516/79 |
| 2007/0128873 A1* | 6/2007 | Minamihaba et al. ....... 438/692 |
| 2007/0181535 A1* | 8/2007 | De Rege Thesauro et al. ............................. 216/89 |
| 2007/0259802 A1 | 11/2007 | Heintz et al. |
| 2008/0057713 A1* | 3/2008 | Desai et al. .................. 438/691 |
| 2008/0153292 A1 | 6/2008 | White et al. |
| 2008/0200033 A1* | 8/2008 | Takemiya .................... 438/693 |
| 2009/0269923 A1* | 10/2009 | Lee et al. ...................... 438/655 |

FOREIGN PATENT DOCUMENTS

| | | |
|---|---|---|
| KR | 1020050016128 A | 2/2005 |
| KR | 1020080042043 A | 5/2008 |
| WO | 2005099388 A2 | 10/2005 |
| WO | 2006035771 A1 | 4/2006 |

* cited by examiner

Primary Examiner — Thomas Pham
(74) Attorney, Agent, or Firm — Thomas Omholt; Erika Wilson

(57) ABSTRACT

The present invention provides a method for selectively removing silicon carbide from the surface of a substrate in preference to silicon dioxide. The method comprises abrading a surface of substrate with a polishing composition that comprises a particulate abrasive, at least one acidic buffering agent, and an aqueous carrier.

24 Claims, 1 Drawing Sheet

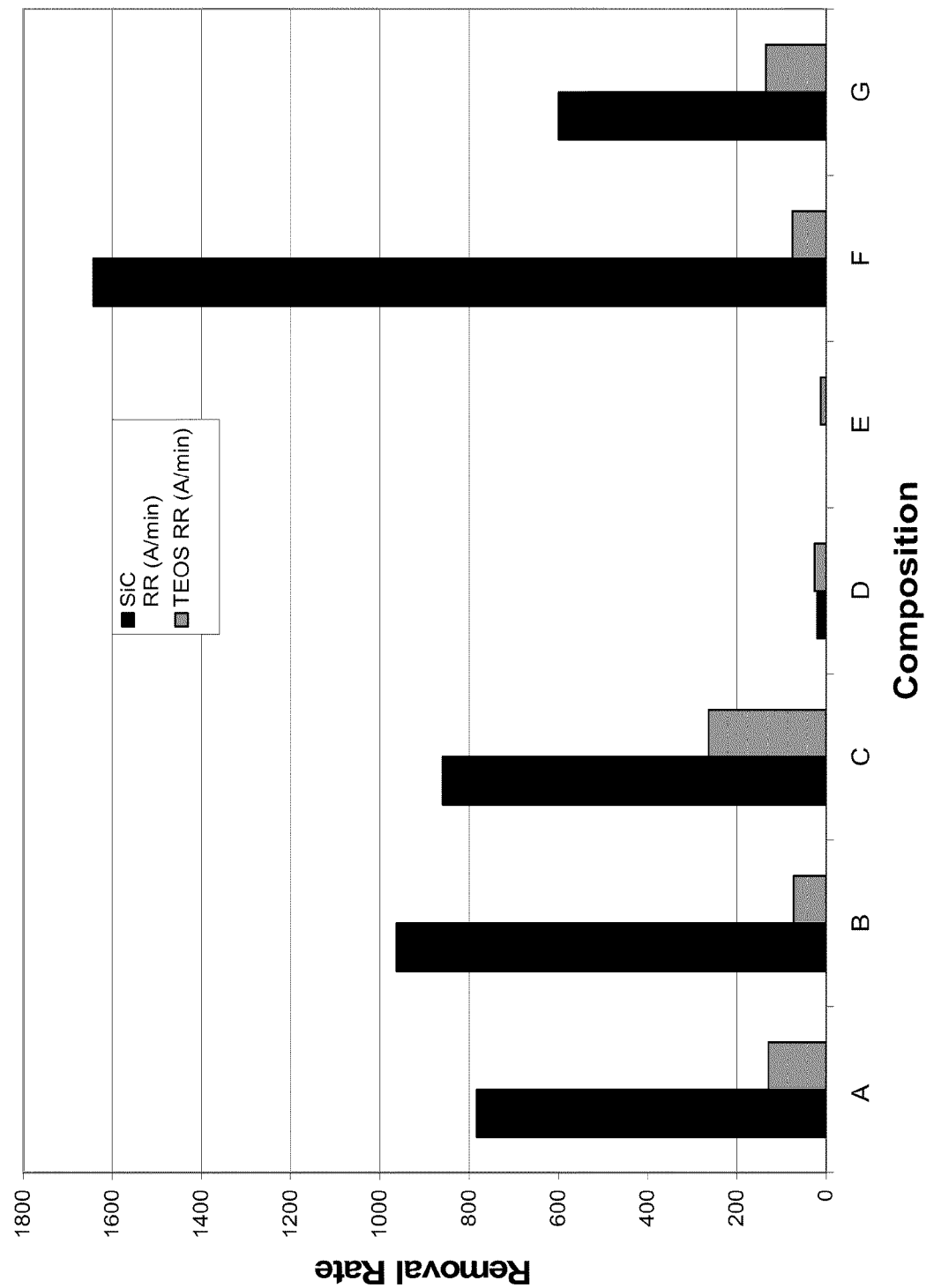

METHOD TO SELECTIVELY POLISH SILICON CARBIDE FILMS

CROSS-REFERENCE TO RELATED APPLICATIONS

This application claims the benefit of U.S. Provisional Application Ser. No. 61/200,812, filed Dec. 4, 2008, which is incorporated herein by reference in its entirety.

FIELD OF THE INVENTION

This invention relates to polishing compositions and methods. More particularly, this invention relates to methods for selectively removing silicon carbide from the surface of a substrate in preference to other materials such as silicon dioxide.

BACKGROUND OF THE INVENTION

Compositions and methods for chemical-mechanical polishing (CMP) of the surface of a substrate are well known in the art. Polishing compositions (also known as polishing slurries, CMP slurries, and CMP compositions) for CMP of surfaces of semiconductor substrates (e.g., integrated circuits) typically contain an abrasive, various additive compounds, and the like.

In general, CMP involves the concurrent chemical and mechanical abrasion of surface, e.g., abrasion of an overlying first layer to expose the surface of a non-planar second layer on which the first layer is formed. One such process is described in U.S. Pat. No. 4,789,648 to Beyer et al. Briefly, Beyer et al., discloses a CMP process using a polishing pad and a slurry to remove a first layer at a faster rate than a second layer until the surface of the overlying first layer of material becomes coplanar with the upper surface of the covered second layer. More detailed explanations of chemical mechanical polishing are found in U.S. Pat. Nos. 4,671,851, 4,910,155 and 4,944,836.

In conventional CMP techniques, a substrate carrier or polishing head is mounted on a carrier assembly and positioned in contact with a polishing pad in a CMP apparatus. The carrier assembly provides a controllable pressure to the substrate, urging the substrate against the polishing pad. The pad and carrier, with its attached substrate, are moved relative to one another. The relative movement of the pad and substrate serves to abrade the surface of the substrate to remove a portion of the material from the substrate surface, thereby polishing the substrate. The polishing of the substrate surface typically is further aided by the chemical activity of the polishing composition (e.g., by oxidizing agents, acids, bases, or other additives present in the CMP composition) and/or the mechanical activity of an abrasive suspended in the polishing composition. Typical abrasive materials include silicon dioxide (silica), cerium oxide (ceria), aluminum oxide (alumina), zirconium oxide (zirconia), and tin oxide.

U.S. Pat. No. 5,527,423 to Neville, et al., for example, describes a method for chemically-mechanically polishing a metal layer by contacting the surface of the metal layer with a polishing slurry comprising high purity fine metal oxide particles suspended in an aqueous medium. Alternatively, the abrasive material may be incorporated into the polishing pad. U.S. Pat. No. 5,489,233 to Cook et al. discloses the use of polishing pads having a surface texture or pattern, and U.S. Pat. No. 5,958,794 to Bruxvoort et al. discloses a fixed abrasive polishing pad.

A semiconductor wafer typically includes a substrate, such as silicon or gallium arsenide, on which a plurality of transistors have been formed. Transistors are chemically and physically connected to the substrate by patterning regions in the substrate and layers on the substrate. The transistors and layers are separated by interlevel dielectrics (ILDs), comprised primarily of some form of silicon dioxide ($SiO_2$). The transistors are interconnected through the use of well-known multilevel interconnects. Typical multilevel interconnects are comprised of stacked thin-films consisting of one or more of the following materials: titanium (Ti), titanium nitride (TiN), tantalum (Ta), aluminum-copper (Al—Cu), aluminum-silicon (Al—Si), copper (Cu), tungsten (W), doped polysilicon (poly-Si), and various combinations thereof. In addition, transistors or groups of transistors are isolated from one another, often through the use of trenches filled with an insulating material such as silicon dioxide, silicon nitride, and/or polysilicon.

Silicon carbide (SiC) is a material with a unique combination of electrical and thermo-physical properties that make it well-suited for use in an electronic device. As disclosed in WO 2005/099388 to Kerr et al., these properties include high breakdown field strength, high practical operating temperature, good electronic mobility and high thermal conductivity. Silicon carbide has a significantly greater hardness and relative chemical inertness compared to many other materials that comprise an integrated circuit. This greater hardness and chemical inertness makes the removal of silicon carbide using CMP techniques difficult. Removing silicon carbide with conventional CMP compositions and methods frequently results in the unwanted removal of other materials such as silicon dioxide.

Although many of the known CMP slurry compositions are suitable for limited purposes, the conventional compositions tend to exhibit unacceptable polishing rates and corresponding selectivity levels to insulator materials used in wafer manufacture. Known polishing slurries tend to produce poor film removal traits for the underlying films, or produce deleterious film-corrosion, which leads to poor manufacturing yields.

In addition, known polishing compositions and methods do not provide the ability to selectively remove silicon carbide from a semiconductor wafer without removing materials such as silicon dioxide from the same wafer at unacceptably high levels. As the technology for integrated circuit devices advances, traditional materials are being used in new and different ways to achieve the level of performance needed for advanced integrated circuits. In particular, silicon nitride, silicon carbide, and silicon dioxide are being used in various combinations to achieved new and ever more complex device configurations. In general, the structural complexity and performance characteristics vary across different applications.

There is an ongoing need to develop new polishing methods and compositions that provide relatively high rates of removal of silicon carbide and to selectively remove silicon carbide in preference to other materials present on the surface of the semiconductor wafer. The present invention provides such improved polishing methods and compositions. These and other advantages of the invention, as well as additional inventive features, will be apparent from the description of the invention provided herein.

BRIEF SUMMARY OF THE INVENTION

The present invention provides methods for polishing silicon carbide from the surface of a substrate in preference to silicon dioxide, as well as polishing compositions useful in such methods. The method of the present invention comprises abrading the surface of the substrate with an aqueous polishing composition comprising a particulate silica abrasive and at least one acidic buffering agent providing a pH in the range of about 2 to about 7. The methods of the present invention selectively remove silicon carbide (as well as silicon nitride) from the surface of the substrate in preference to silicon dioxide. In particular, the methods and compositions of the present invention provide a greater removal rate for silicon carbide when polishing a semiconductor wafer than the corresponding silicon dioxide removal rate.

In a preferred embodiment, the present invention provides a method for selectively removing silicon carbide from the surface of a substrate in preference to silicon dioxide (particularly PETEOS silicon dioxide). The silicon carbide may or may not contain at least some nitrogen. As used herein, the term "silicon carbide" refers to substantially pure silicon carbide and to a silicon carbide materials that include some nitrogen in the film matrix. For convenience, nitrogen-containing silicon carbide is represented herein as "SiCN" when specific reference is being made to such materials. Silicon carbide that is substantially free of nitrogen is referred to as substantially pure silicon carbide, or for convenience, "SiC". The polishing composition is capable of abrading silicon carbide present on the surface of the substrate at a removal rate higher than the removal rate for concurrent abrading of silicon dioxide present on the surface of the substrate. Preferably, in the silicon carbide films containing nitrogen, the portion of the substrate has a nitrogen content of at least about 1 weight percent nitrogen, and not more than about 25 weight percent nitrogen (e.g., about 1 to about 20 weight percent).

The acidic buffering agent is selected to provide a predetermined composition pH in the range of about 2 to 7 (e.g., about 2 to about 5, more preferably about 3.3 to about 4.5), and preferably a predetermined pH buffering capacity. Preferably, the buffering agent comprises an organic acid (preferably less than about 0.5 percent by weight) such as a carboxylic acid, a phosphonic acid, or a combination of the two. More preferably, the acidic buffering agent comprises acetic acid, 1-hydroxyethylidene-1,1-diphosphonic acid, and/or glycine. In other embodiments, the acidic buffering agent can comprise an inorganic acid such as phosphoric acid.

The degree of removal rate selectivity for silicon carbide and silicon nitride versus silicon dioxide ($SiO_2$) varies depending upon the acidic buffering agent and pH of the composition, as well as the concentration of the abrasive. The highest silicon carbide and silicon nitride removal rates obtained with the methods and compositions of the present invention generally occur within the pH range in which the chosen acidic buffering agent exhibits its optimum buffering capacity. For example, the optimum pH for silicon carbide removal obtained with a phosphonic acid is generally lower than the optimum pH for silicon carbide removal obtained with a composition containing a carboxylic acid. For example, the optimum pH for silicon carbide removal (particularly for SiCN removal) for a phosphonic acid-containing composition is typically in the range of pH 3 to pH 4; whereas the optimum pH for a carboxylic acid-containing composition may be closer to pH 4 to pH 4.5. For silicon carbide removal selectivity relative to silicon dioxide materials that are generally more easily abraded and removed than PETEOS silicon dioxide, it is preferred that the pH be in the range of about 3 to about 7, preferably above 3.5.

The particulate abrasive used in the compositions and methods of the invention comprises a silica material such as colloidal silica, fumed silica, or alumina-doped silica, preferably having a mean particle size in the range of about 20 nanometers to about 150 nanometers. In some preferred embodiments, the composition comprises about 0.1 to about 5 percent by weight of particulate abrasive and about 50 ppm to about 150 ppm (about 0.005 to about 0.015 percent by weight) of at least one acidic buffering agent. A particularly preferred silica material is an alumina-doped colloidal silica, preferably having a mean particle size in the range of about 40 to about 150 nm (e.g., about 40 to about 50 nm).

The CMP compositions and methods described herein provide an unexpectedly high selectivity for silicon carbide removal compared to silicon dioxide (e.g., PETEOS silicon dioxide) removal. Typically, the silicon carbide removal rate obtained during polishing of a semiconductor wafer according to the methodology of the present invention exceeds the PETEOS silicon dioxide removal rate by a factor of about 3 or more, more typically by a factor of about 20 or more.

In another aspect, the present invention provides a chemical-mechanical polishing method for modulating the silicon carbide-to-silicon dioxide removal rate ratio when polishing a suitable substrate. In general, silicon dioxide removal rates described herein refer to removal of any type of silicon dioxide, preferably PETEOS-type silicon dioxide (i.e., silicon dioxide formed by plasma-enhanced tetraethylorthosilicate decomposition, sometimes also abbreviated as TEOS). For example, the modulating method includes polishing a silicon carbide substrate and a silicon dioxide substrate under predetermined polishing conditions with a CMP composition comprising a particulate silica abrasive and an acidic buffering agent, and determining the selectivity for the silicon carbide removal relative to silicon dioxide removal achieved by this polishing. The selectivity (e.g., the silicon carbide-to-silicon dioxide removal rate ratio) is then decreased or increased by altering the pH of the composition, altering the concentration of the buffering agent in the composition, altering the concentration of silica in the composition, or altering a combination of two or more of these parameters.

BRIEF DESCRIPTION OF THE DRAWINGS

FIG. 1 is a chart illustrating the silicon carbide-to-silicon dioxide removal rate ratio of CMP compositions containing various acidic buffering agents.

DETAILED DESCRIPTION OF THE INVENTION

The present invention provides methods for selectively removing silicon carbide from the surface of a substrate in preference to silicon dioxide. In a preferred embodiment, the method comprises abrading a surface of the substrate with a polishing composition comprising a particulate abrasive, at least one acidic buffering agent providing a composition pH in the range of about 2 to about 7, and an aqueous carrier. The polishing composition is capable of abrading silicon carbide present on the surface of the substrate at a removal rate higher than the removal rate of silicon dioxide present on the surface of the substrate. The composition and methods discussed herein provided the unexpected result of removing silicon carbide on the surface of the substrate at a significantly higher removal rate than the removal rate of the silicon dioxide present on the surface of the substrate.

The particulate abrasive used in the compositions and methods of the invention comprises a silica material. The silica can comprise colloidal silica, fumed silica, alumina-doped silica, and the like or any combination thereof. In a preferred embodiment, the particulate abrasive comprises colloidal silica (particularly alumina-doped colloidal silica). The abrasive preferably is present in the polishing composition at a concentration in the range of about 0.1 to about 5 percent by weight. More preferably, the abrasive is present in the CMP composition at a concentration in the range of about 0.5 to about 2 percent by weight. The abrasive particles preferably have a mean particle size in the range of about 20 nanometers to about 150 nanometers, as determined by laser light scattering techniques which are well known in the art. In some embodiments, the silica can have a mean particle size in the range of about 25 to about 75 nm (e.g., about 30 to 70 nm). In other embodiments, the mean silica particle size is in the range of about 80 to about 140 nm (e.g. about 90 to 130 nm). A particularly preferred abrasive comprises alumina-doped colloidal silica, preferably having a particle size in the range of about 40 to 150 nm (e.g., about 40 to about 50 nm).

The abrasive desirably is suspended in the polishing composition, more specifically in the aqueous carrier component of the polishing composition. When the abrasive is suspended in the polishing composition, it preferably is colloidally stable. The term "colloid" refers to the suspension of abrasive particles in the liquid carrier. "Colloidal stability" refers to the maintenance of that suspension over time. In the context of this invention, an abrasive suspension is considered colloidally stable if, when the abrasive is placed into a 100 mL graduated cylinder and allowed to stand without agitation for a time of 2 hours, the difference between the concentration of particles in the bottom 50 mL of the graduated cylinder ([B] in terms of g/mL) and the concentration of particles in the top 50 mL of the graduated cylinder ([T] in terms of g/mL) divided by the total concentration of particles in the abrasive composition ([C] in terms of g/mL) is less than or equal to 0.5 (i.e., ([B]−[T])/[C]≤0.5). The value of ([B]−[T])/[C] desirably is less than or equal to 0.3, and preferably is less than or equal to 0.1.

As used herein and in the appended claims, the term "colloidal silica" refers to silicon dioxide that has been prepared by condensation polymerization of $Si(OH)_4$. The precursor $Si(OH)_4$ can be obtained, for example, by hydrolysis of high purity alkoxysilanes, or by acidification of aqueous silicate solutions. Such colloidal silica can be prepared, for example, in accordance with U.S. Pat. No. 5,230,833 or can be obtained as various commercially available products, such as the Fuso PL-1, PL-2, and PL-3 products, and the Nalco 1050, 2327, and 2329 products, as well as other similar products available from DuPont, Bayer, Applied Research, Nissan Chemical, and Clariant. Alumina-doped colloidal silica refers to a colloidal silica including some amount of aluminum, e.g., as an oxide such as alumina, a mixed oxide with silicon, and the like. Preferably the alumina-doped silica includes about 100 to about 2000 ppm of aluminum based on the particulate weight, more preferably about 600 to 800 ppm (e.g., about 650 to about 750 ppm).

The acidic buffering agent is present in the composition at a concentration in the range of about 25 ppm to about 10,000 ppm, preferably about 50 ppm to 1000 ppm, and more preferably about 50 ppm to about 700 ppm.

The acidic buffering agent can comprise any organic acid or inorganic acid capable of providing a suitable buffering capacity at a desired acidic pH value. Methods for selecting and determining buffer pH and buffer capacity are well known to those of ordinary skill in the chemical and CMP arts. In some preferred embodiments, the buffering agent comprises an organic acid such as a carboxylic acid, a phosphonic acid, or a combination thereof. Non-limiting examples of suitable carboxylic acids include monocarboxylic acids (e.g., acetic acid, benzoic acid, phenylacetic acid, 1-naphthoic acid, 2-naphthoic acid, glycolic acid, formic acid, lactic acid, mandelic acid, and the like), and polycarboxylic acids (e.g., oxalic acid, malonic acid, succinic acid, adipic acid, tartaric acid, citric acid, maleic acid, fumaric acid, aspartic acid, glutamic acid, phthalic acid, isophthalic acid, terephthalic acid, 1,2,3,4-butanetetracarboxylic acid, itaconic acid, and the like), as well as amino acids (e.g., glycine, proline, asparagine, glutamine, glutamic acid, aspartic acid, phenylalanine, alanine, beta-alanine, and the like). Non-limiting examples of suitable organic phosphonic acids include, DEQUEST® 2060 brand diethylene triamine penta(methylene-phosphonic acid), DEQUEST® 7000 brand 2-phosphonobutane-1,2,4-tricarboxylic acid, and DEQUEST® 2010 brand hydroxyethylidene-1,1-diphosphonic acid, all of which are available from Solutia, Inc., as well as phosphonoacetic acid, iminodi(methylphosphonic acid), and the like. In other preferred embodiments, the buffering composition can comprise an inorganic acid such as phosphoric acid, and the like. Preferably, the acidic buffering agent comprises acetic acid, phosphoric acid, hydroxyethylidene-1,1-diphosphonic acid, and/or glycine. When an organic acid buffering agent is utilized, the organic acid preferably is present in the composition in an amount of less than about 0.5 percent by weight.

The acidic buffering agent preferably possesses an acceptable buffering capacity at the desired pH of the composition. The acidic buffering agent typically includes one or more acids and one or more salts of the acid in relative amounts sufficient to establish the pH of the CMP composition at a desired pH value, and to maintain that pH within an acceptable range above and below the desired pH during the CMP process. A preferred pH range is about 2 to about 7 (e.g., about 2 to 5, preferably 3 to 4.5). For silicon carbide removal selectivity relative to silicon dioxide materials that are generally more easily abraded and removed than PETEOS silicon dioxide (e.g., silane-derived silicon dioxide; sometimes referred to as "soft oxides"), it is preferred that the pH be in the range of about 3 to about 7 (preferably above 3.5). Preferred acidic buffering agents for obtaining selective silicon carbide removal relative to such soft oxides are materials having an optimum buffering capacity in the pH range of about 3 to about 7 (preferably above 3.5), such as, for example, amino acids.

The aqueous carrier can be any aqueous solvent, e.g., water, aqueous methanol, aqueous ethanol, a combination thereof, and the like. Preferably, the aqueous carrier is deionized water.

Preferably, the CMP composition is free of surfactants and oxidizing agents. As used herein the phrase, "free of surfactants" means the composition has no more than trace amounts of surfactants that are bound to the abrasive, with any amount of non-bound surfactant being present at a level that does not affect the surface tension or contact angle of the composition. The phase "free of oxidizing agents" means that the compositions include no more than trace contaminant amounts of oxidizing materials, which amounts are insufficient to affect any metal removal rate obtainable with the composition during CMP.

In some preferred embodiments, the composition includes less than about 0.5 percent by weight of organic materials.

The polishing compositions of the invention can be prepared by any suitable technique, many of which are known to those skilled in the art. The polishing composition can be prepared in a batch or continuous process. Generally, the polishing composition can be prepared by combining the components thereof in any order. The term "component" as used herein includes individual ingredients (e.g., abrasive, buffering agent, and the like), as well as any combination of ingredients. For example, the abrasive can be dispersed in water, and the acidic buffering agent can be added, and mixed by any method that is capable of incorporating the components into the polishing composition. The pH can be further adjusted at any suitable time by addition of an acid or base, as needed.

The polishing compositions of the present invention can be used to polish any suitable substrate, and are especially useful for polishing substrates comprising silicon carbide and silicon dioxide (e.g., PETEOS silicon dioxide). The formulation and pH of the CMP composition can be varied to vary the silicon carbide removal rate. In some preferred embodiments, the relative rate of silicon carbide removal exceeds the rate for removal of the silicon dioxide.

Varying the pH, abrasive composition and concentration, surface tension, and acidic buffering agent composition and concentration of the compositions can change the rate of removal of silicon carbide and silicon dioxide obtained according to the methods of the invention, and thus can alter the silicon carbide-to-silicon dioxide removal rate ratio.

For example, the abrasive concentration present in the composition can be varied to adjust the rate of removal of both silicon carbide and silicon dioxide. Using the general procedure described below in Example 1, three different polishing compounds were used to separately chemically-mechanically polish similar semiconductor wafers. All of the polishing compositions were prepared in deionized water with colloidal silica having a mean particle size of about 50 nanometers. All of the polishing compositions had a pH of about 4. The amount of colloidal silica was adjusted to create compositions having about 0.5%, 1.0% and 2.0% by weight of colloidal silica.

The selective removal of silicon carbide in preference to PETEOS silicon dioxide was observed throughout this colloidal silica concentration range. The selectivity ratio of silicon carbide removal rate-to-silicon dioxide removal rate was inversely related to the concentration of colloidal silica in this concentration range, but was at all times greater than about 11 throughout this range and under the stated polishing conditions. Thus, the present methods provide for tuning the silicon carbide-to-silicon dioxide removal rate selectivity.

The pH of the composition can also be varied to change the rate of removal of both silicon carbide and silicon dioxide. For example, SiCN and PETEOS $SiO_2$ wafers were polished using the general procedure described below in Example 1, with compositions having pH values in the range of about 2.5 to about 9. All of the polishing compositions contained about 0.5% by weight of colloidal silica having a mean particle size of about 50 nanometers. Selective removal of silicon carbide in preference to silicon dioxide was observed for each composition having a pH in the range of about 3 to about 8. The highest silicon carbide-to-silicon dioxide removal rate ratios occurred in the compositions having a pH in the range of about 3.25 to about 4.5. Accordingly, the silicon carbide-to-silicon dioxide selectivity of the compositions of the invention can be "tuned" by appropriate choice of the pH and buffering agent, as well.

For example, the type of acidic buffering agent can be varied to change the rate of removal of both silicon carbide and silicon dioxide. The effect of varying the type of acidic buffering agent is described below in Example 2. Similarly, the concentration of acidic buffering agent can be varied to change the rate of removal of both silicon carbide and silicon dioxide. The effect of varying the concentration of the acidic buffering agent is described below in Example 3.

Also, the type of particulate abrasive used in the composition can be varied to change the rate of removal of silicon carbide and silicon dioxide. The effect of varying the type of particulate abrasive is described below in Example 4.

The silicon carbide layers described in Examples 1 through 4 each contain nitrogen. The compositions of the present invention can also be used to selectively polish substrates containing silicon carbide layers that are substantially free of nitrogen. The effect of varying the type of particulate abrasive, the abrasive concentration, and the pH of the composition used to polish a nitrogen-free silicon carbide layer is described below in Example 5.

The methods of the present invention can be implemented in a typical CMP polishing process by (i) contacting a surface of a substrate with a polishing pad and a polishing composition of the invention as described herein, and (ii) moving the polishing pad and the surface of the substrate relative to one another, while maintaining at least a portion of the polishing composition between the pad and the surface, thereby abrading at least a portion of the surface to polish the substrate. The substrate to be polished includes PETEOS silicon dioxide, as well as silicon carbide and/or silicon nitride.

The polishing compositions and methods of the present invention are particularly suited for use in conjunction with a chemical-mechanical polishing apparatus. Typically, the CMP apparatus comprises a platen, which, when in use, is in motion and has a velocity that results from orbital, linear, and/or circular motion, a polishing pad in contact with the platen and moving relative to the platen when in motion, and a carrier that holds a substrate to be polished by contacting and moving relative to the surface of the polishing pad. The polishing of the substrate takes place by the substrate being placed in contact with the polishing pad and a polishing composition of the invention and then moving the polishing pad relative to the substrate, so as to abrade at least a portion of the substrate to polish the substrate.

A substrate can be planarized or polished with a polishing composition of the invention using any suitable polishing pad (e.g., polishing surface). Suitable polishing pads include, for example, woven and non-woven polishing pads, grooved or non-grooved pads, porous or non-porous pads, and the like. Moreover, suitable polishing pads can comprise any suitable polymer of varying density, hardness, thickness, compressibility, ability to rebound upon compression, and compression modulus. Suitable polymers include, for example, polyvinylchloride, polyvinylfluoride, nylon, fluorocarbon, polycarbonate, polyester, polyacrylate, polyether, polyethylene, polyamide, polyurethane, polystyrene, polypropylene, coformed products thereof, and mixtures thereof.

Desirably, the CMP apparatus further comprises an in situ polishing endpoint detection system, many of which are known in the art. Techniques for inspecting and monitoring the polishing process by analyzing light or other radiation reflected from a surface of the workpiece are known in the art. Such methods are described, for example, in U.S. Pat. No. 5,196,353 to Sandhu et al., U.S. Pat. No. 5,433,651 to Lustig et al., U.S. Pat. No. 5,949,927 to Tang, and U.S. Pat. No. 5,964,643 to Birang et al. Desirably, the inspection or monitoring of the progress of the polishing process with respect to a workpiece being polished enables the determination of the polishing end-point, i.e., the determination of when to terminate the polishing process with respect to a particular workpiece.

The compositions and methods of the invention provide useful silicon carbide and/or silicon nitride removal rates over a range of pH, silica concentration, and particle size, as well as the acidic buffering agent concentration. The following examples further illustrate the invention but, of course, should not be construed as in any way limiting its scope.

EXAMPLE 1

A general procedure was used to confirm the polishing properties of the composition and methods of the invention. In particular, silicon carbide wafers and silicon dioxide wafers (200 mm diameter) were cut down to 1.65 inch squares and polished with a polishing composition having various components.

The silicon carbide wafers were purchased from Silicon Valley Microelectronics, Inc. (SVMI) in Santa Clara, Calif. As reported by the manufacturer, the silicon carbide wafers have a 3000 Angstrom layer of silicon carbide on top of a silicon substrate, and the ratio of Si:C in the silicon carbide layer is 1:0.7-0.9 (e.g. containing between 70 and 90 mol percent silicon carbide) the balance of the silicon being bound to nitrogen (e.g., as $Si_3N_4$, which provides a nitrogen content in the range of about 4.5 to 13 percent by weight). PETEOS silicon dioxide blanket wafers were polished under the same conditions to obtain silicon dioxide removal rates.

The polishing was performed on a bench-top polisher using a 20 inch D100 AC grooved pad at a down force of about 4 pounds-per-square-inch (psi), a platen speed of about 90 revolutions-per-minute (rpm), a carrier speed of about 84 rpm, and a polishing slurry flow rate of about 80 milliliters-per-minute (mL/min). All of the polishing compositions were prepared in deionized water. The pad was conditioned with a five inch, 100 grit diamond conditioner.

EXAMPLE 2

Using the general procedure of Example 1, the silicon carbide-to-silicon dioxide ($SiCN:SiO_2$) selectivity ratios of four compositions containing different acidic buffering agents were evaluated. All four compositions contained about 0.5% by weight colloidal silica having a mean particle size of about 50 nm. The pH of each composition was adjusted between about 3 and about 5 in increments of about 0.5 pH units by adding potassium hydroxide (KOH) or nitric acid ($HNO_3$) as necessary. The rates of removal of silicon carbide and silicon dioxide from the semiconductor wafers using each of the compositions are shown in Angstroms per minute (Å/min) in Tables 2-5. The identity of the acidic buffering agent for each composition is shown in Table 1.

TABLE 1

| Composition | Buffering Agent Acidic Buffering Agent | Amount of Acidic Buffering Agent (ppm)* |
|---|---|---|
| A | None | None |
| B | Acetic Acid | 350 |
| C | Boric Acid | 300 |
| D | 2,6 Dihydroxybenzoic Acid | 400 |

*ppm on an actives weight basis

Table 2 shows the silicon carbide and silicon dioxide removal rates at different composition pH levels for a comparative Composition A, which was not buffered.

TABLE 2

Removal Rate Obtained with Composition A

| Composition pH | SiCN average removal rate (Å/min) | $SiO_2$ average removal rate (Å/min) | $SiCN:SiO_2$ selectivity ratio |
|---|---|---|---|
| 3.0 | 79.5 | 387 | 0.21 |
| 3.5 | 1167 | 161 | 7.25 |
| 4 | 641.5 | 43 | 15.09 |
| 4.5 | 292 | 17 | 17.18 |

Table 3 shows the silicon carbide and silicon dioxide removal rates at different composition pH levels for Composition B, which included acetate buffer.

TABLE 3

Removal Rate Obtained with Composition B

| Composition pH | SiCN average removal rate (Å/min) | $SiO_2$ average removal rate (Å/min) | $SiCN:SiO_2$ selectivity ratio |
|---|---|---|---|
| 3.0 | 118 | 161 | 0.74 |
| 3.5 | 431 | 123 | 3.52 |
| 4 | 947 | 87 | 10.89 |
| 4.5 | 1121 | 105 | 10.73 |

Table 4 shows the silicon carbide and silicon dioxide removal rates at different composition pH levels for Composition C, which included a borate buffer.

TABLE 4

Removal Rate Obtained with Composition C

| Composition pH | SiCN average removal rate (Å/min) | $SiO_2$ average removal rate (Å/min) | $SiCN:SiO_2$ selectivity ratio |
|---|---|---|---|
| 3.0 | 130.5 | 229 | 0.57 |
| 3.5 | 1387.5 | 79 | 17.56 |
| 4 | 922.5 | 44 | 21.21 |
| 4.5 | 703.5 | 31 | 22.69 |

Table 5 shows the silicon carbide and silicon dioxide removal rates at different composition pH levels for Composition D, which included a dihydroxybenzoate buffer.

TABLE 5

Removal Rate Obtained with Composition D

| Composition pH | SiCN average removal rate (Å/min) | $SiO_2$ average removal rate (Å/min) | $SiCN:SiO_2$ selectivity ratio |
|---|---|---|---|
| 3.0 | 145 | 124 | 1.17 |
| 3.5 | 664.5 | 69 | 9.70 |
| 4 | 386.5 | 11 | 35.14 |
| 4.5 | 795 | 34 | 23.38 |

FIG. 1 contains a chart illustrating additional examples of the rates of removal of silicon carbide and silicon dioxide using compositions containing various phosphonic acids or carboxylic acids as the acidic buffering agent. A single replicate of each composition was run using the general procedure of Example 1, except that two replicates of Composition A were run. The rates of removal from the two runs using Composition A were averaged, and this average value is represented in Table 6. The identity of the acidic buffering agent for each composition is shown in Table 6.

TABLE 6

Buffering Agents Represented in FIG. 1

| Composition | Acidic Buffering Agent | Amount of Acidic Buffering Agent (ppm)* | pH of Composition |
|---|---|---|---|
| A | hydroxyethylidene-1,1-diphosphonic acid | 100 | 2.98 |
| B | 2-phosphonobutane-1,2,4-tricarboxylic acid | 131 | 3.52 |
| C | diethylene triamine penta(methylene-phosphonic acid | 278 | 2.5 |
| D | hexamethylene diamine tetraphosphonic acid | 350 | 6.63 |
| E | amino-tri(methylene phosphonic acid) | 145 | 2.95 |
| F | trihydroxidooxidophosphorus phosphoric acid | 50 | 3.55 |
| G | 2-[2-(Bis(carboxymethyl)amino)ethyl-(carboxymethyl)amino]acetic acid | 141 | 3.58 |

*ppm on an actives weight basis

The rates of removal of silicon carbide and silicon dioxide from the semiconductor wafers using the compositions identified in Table 6 are shown in Å/min in Table 7.

TABLE 7

Removal Rates Shown in FIG. 1

| Composition | SiCN average removal rate (Å/min) | SiO$_2$ average removal rate (Å/min) | SiCN:SiO$_2$ selectivity ratio |
|---|---|---|---|
| A | 920 | 153 | 6.0 |
| B | 963 | 72.5 | 13.3 |
| C | 860 | 263.5 | 3.3 |
| D | 20 | 25.5 | 0.8 |
| E | 0 | 12 | 0 |
| F | 1642 | 75 | 21.0 |
| G | 599 | 135.5 | 4.4 |

As the data in FIG. 1 and Tables 2-5 and 7 show, optimal selectivity for silicon carbide occurred when the pH of the composition approached about 4 to 4.5, and when the type of buffer used in the composition was a borate buffer, a dihydroxybenzoate buffer, or phosphoric acid.

EXAMPLE 3

Using the general procedure of Example 1, the silicon carbide-to-silicon dioxide selectivity ratio of a composition containing different concentrations of hydroxyethylidene-1,1-diphosphonic acid was measured. The composition had a pH of about 2.5 and contained about 0.5% by weight colloidal silica having a mean particle size of about 50 nm. The amount of hydroxyethylidene-1,1-diphosphonic acid was varied from about 50 ppm to about 3000 ppm on an actives weight basis. The pH of each composition was adjusted to about 2.5 by adding potassium hydroxide (KOH) or nitric acid (HNO$_3$) as necessary. The rate of removal of silicon carbide and silicon dioxide from the semiconductor wafers using each of the compositions is reported in Å/min. The results are shown in Table 8.

TABLE 8

Phosphonic Acid Concentration and Removal Rates

| Amount of Acidic Buffering Agent (ppm) | SiCN average removal rate (Å/min) | SiO$_2$ average removal rate (Å/min) | SiCN:SiO$_2$ selectivity ratio |
|---|---|---|---|
| 50 | 475.5 | 175.5 | 2.7 |
| 100 | 498.5 | 179 | 2.8 |
| 200 | 517 | 185 | 2.8 |
| 400 | 616.5 | 188.5 | 3.3 |
| 800 | 630 | 180 | 3.5 |
| 2000 | 637.5 | 176.5 | 3.6 |
| 3000 | 594 | 159.5 | 3.7 |

EXAMPLE 4

Using the general procedure of Example 1, the silicon carbide and silicon dioxide removal rates of four compositions containing different types of particle abrasives were measured. All four compositions contained about 0.5% by weight of the abrasive and acetic acid buffering agent in the amount shown in Tables 9-12. The composition pH was varied from about 4 to about 7 by adding acetic acid.

Table 9 shows the silicon carbide and silicon dioxide removal rates at different composition pH levels for a composition containing alumina-doped silicon dioxide having a mean particle size of about 40-50 nm.

TABLE 9

Removal Rates Obtained With Alumina-Doped Silica

| Composition pH | SiCN average removal rate (Å/min) | SiO$_2$ average removal rate (Å/min) | SiCN:SiO$_2$ selectivity ratio | Amount of Acetic Acid (ppm) |
|---|---|---|---|---|
| 3.35 | 1620 | 41.5 | 39.0 | 564 |
| 3.93 | 1550 | 25 | 62.0 | 40 |
| 5.23 | 359 | 3.5 | 102.6 | 0 |

Table 10 shows the silicon carbide and silicon dioxide removal rates at different composition pH levels for a composition containing fumed silicon dioxide having a mean particle size of about 110-130 nm.

TABLE 10

Removal Rate Obtained With Fumed Silica

| Composition pH | SiCN average removal rate (Å/min) | SiO$_2$ average removal rate (Å/min) | SiCN:SiO$_2$ selectivity ratio | Amount of Acetic Acid (ppm) |
|---|---|---|---|---|
| 3.42 | 122 | 57.5 | 2.1 | 500 |
| 4.20 | 126 | 42 | 3.0 | 50 |
| 6.80 | 92 | 30.5 | 3.0 | 0 |

For comparative purposes, Table 11 shows the silicon carbide and silicon dioxide removal rates at different composition pH levels for a composition containing aluminum oxide having a mean particle size of about 90-110 nm.

TABLE 11

Removal Rate Obtained With Aluminum Oxide

| Composition pH | SiCN average removal rate (Å/min) | SiO$_2$ average removal rate (Å/min) | SiCN:SiO$_2$ selectivity ratio | Amount of Acetic Acid (ppm) |
|---|---|---|---|---|
| 3.53 | 27 | 23.5 | 1.1 | 500 |
| 4.02 | 31 | 46 | 0.7 | 100 |
| 4.20 | 35 | 43.5 | 0.8 | 0 |

Also for comparison purposes, Table 12 shows the silicon carbide and silicon dioxide removal rates at different composition pH levels for a composition containing cerium oxide having a mean particle size of about 110-130 nm.

TABLE 12

Removal Rate Obtained With Cerium Oxide

| Composition pH | SiCN average removal rate (Å/min) | SiO$_2$ average removal rate (Å/min) | SiCN:SiO$_2$ selectivity ratio | Amount of Acetic Acid (ppm) |
|---|---|---|---|---|
| 3.33 | 33 | 112.5 | 0.29 | 600 |
| 3.73 | 48 | 1211.5 | 0.04 | 50 |
| 4.44 | 41 | 796 | 0.05 | 0 |

As shown in Tables 9-12, compositions containing alumina-doped silica or fumed silica provided a surprising preferential removal of silicon carbide in preference to silicon dioxide compared to the ceria and alumina containing compositions. In fact, compositions containing ceria produced the opposite result and removed silicon dioxide in preference to silicon carbide. Compositions containing alumina did not exhibit a strong preference in removal of silicon carbide or silicon dioxide and provided poor removal rates, overall, compared to the silica-containing compositions.

EXAMPLE 5

The silicon carbide removal rates of wafers containing silicon carbide materials that are substantially free of nitrogen were also measured. The silicon carbide blanket wafers were obtained from two different manufacturers and analyzed using the general procedure of Example 1 in comparison to silicon dioxide blanket wafers. These wafers from the two manufacturers are identified as M1 and M2 in Tables 13-15. PETEOS silicon dioxide blanket wafers were also analyzed using the general procedure of Example 1 to obtain silicon dioxide removal rates under the same polishing conditions.

Three types of particulate abrasives were tested in compositions have various abrasive concentrations and pH levels. The composition pH was varied by adding various acidic buffering agents identified in the Tables below.

Table 13 shows the silicon carbide and silicon dioxide removal rates at different composition pH and abrasive concentration levels for a composition containing colloidal silica having a mean particle size of about 50 nm.

TABLE 13

Removal Rates of M1 and M2 Silicon Carbide Obtained with Colloidal Silica

| Abrasive Concentration (weight percent) | Acidic Buffering Agent Concentration (ppm) | pH | SiC average removal rate for M1 wafer (Å/min) | SiC average removal rate for M2 wafer (Å/min) | SiO$_2$ average removal rate (Å/min) |
|---|---|---|---|---|---|
| 0.50 | DEQUEST ® 2010 (800) | 2.3 | 77.5 | 146 | 87 |
| 0.50 | Acetic Acid (350) | 4.0 | 149 | 83 | 41 |
| 2.00 | Acetic Acid (350) | 3.8 | 286 | 209 | 108 |
| 0.25 | Acetic Acid (100) | 3.9 | 142.5 | 37 | 27 |
| 0.50 | Acetic Acid (150) | 3.9 | 199 | 59 | 53 |

Table 14 shows the silicon carbide and silicon dioxide removal rates at different composition pH and abrasive concentration levels for a composition containing alumina-doped silica having a mean particle size of about 40-50 nm.

TABLE 14

Removal Rates of M2 Silicon Carbide Obtained with Alumina-Doped Silica

| Abrasive Concentration (weight percent) | Acidic Buffering Agent Concentration (ppm) | pH | SiC average removal rate (Å/min) | SiO$_2$ average removal rate (Å/min) |
|---|---|---|---|---|
| 0.50 | Phosphoric Acid (100) | 3.1 | 320 | 16 |
| 1.00 | Phosphoric Acid (100) | 3.1 | 355 | 30 |
| 2.00 | Phosphoric Acid (100) | 2.9 | 403 | 36 |
| 0.50 | Acetic Acid (300) | 3.5 | 243 | 21 |
| 2.00 | Acetic Acid (300) | 3.5 | 446 | 26 |

Table 15 shows the silicon carbide and PETEOS silicon dioxide removal rates at different composition pH and abrasive concentration levels for a composition containing acidic colloidal silica having a mean particle size of about 35 nm.

TABLE 15

Removal Rates of M2 Silicon Carbide Obtained with Acidic Colloidal Silica

| Abrasive Concentration (weight percent) | Acidic Buffering Agent Concentration (ppm) | pH | SiC average removal rate (Å/min) | SiO$_2$ average removal rate (Å/min) |
|---|---|---|---|---|
| 0.50 | Acetic Acid (300) | 3.2 | 216 | 14 |
| 2.00 | Acetic Acid (300) | 3.2 | 320 | 34 |
| 0.50 | Phosphoric Acid (100) | 2.9 | 241 | 13 |
| 2.00 | Phosphoric Acid (100) | 2.8 | 346 | 39 |

EXAMPLE 6

The silicon carbide removal rates of wafers containing silicon carbide were also measured with a variety of acidic buffering agents including amino acids. Silicon carbide, PETEOS silicon dioxide, and silane-based silicon dioxide ("soft oxide") blanket wafers were polished with polishing slurries comprising about 2% by weight alumina-doped colloidal silica (mean particle size of about 40-50 nm and an aluminum level of about 650 to about 750 ppm based on particles solids weight), and an acidic buffering agent as specified in Table 16, under the following conditions: Logitech Polisher, Politex REG E1120 pad, downforce=3 psi, platen speed=90 rpm, carrier speed=84 rpm, polishing time=60 seconds, and polishing slurry flow rate=80 mL/min. Table 16 summarizes the buffering agent, the buffering agent concentration, and the slurry pH, as well as the observed removal rates. As is evident in Table 16, all of the buffering agent provided a very high selectivity for silicon carbide removal relative to PETEOS silicon dioxide. In addition, the amine acid-type buffering agents (e.g., glycine, beta-alanine, proline, glutamine, and phenylalanine) also surprisingly provided excellent selectivity for silicon carbide removal relative to the silane-derived silicon dioxide.

dioxide, slurries containing acetic acid as the buffering agent, and alumina-doped colloidal silica (40-50 nm; 650-750 ppm Al) were evaluated at different buffering agent and particle concentrations levels, under the same polishing conditions used above in this Example. The results are shown in Table 18.

TABLE 18

Removal Rates as Function of Slurry Concentration

| Abrasive Conc. (wt %) | Acidic Buffering Agent Conc. (ppm) | pH | PETEOS RR (Å/min) | Silane SiO$_2$ RR (Å/min) | Silicon Carbide RR (Å/min) | Silicon Nitride RR (Å/min) |
| --- | --- | --- | --- | --- | --- | --- |
| 2.0 | 500 | 3.5 | 15 | 824 | 620 | 561 |
| 1.0 | 250 | 3.7 | 1 | 22 | 517 | 406 |
| 0.5 | 125 | 3.8 | 5 | 4 | 463 | 367 |
| 0.25 | 62 | 3.9 | 1 | 2 | 379 | 306 |
| 0.15 | 38 | 4.0 | 1 | 1 | 360 | 292 |

TABLE 16

Removal Rates of Silicon Carbide and Silicon Dioxide Obtained with Alumina-Doped Colloidal Silica

| Buffering Agent | Buffering Agent Con. (ppm) | pH | SiC RR (Å/min) | PETEOS RR (Å/min) | Silane SiO$_2$ RR (Å/min) |
| --- | --- | --- | --- | --- | --- |
| Acetic acid | 500 | 3.24 | 447 | 3 | 642 |
| Glycine | 625 | 4.15 | 379 | 4 | 0 |
| Beta-alanine | 859 | 5.05 | 335 | 3 | 0 |
| Proline | 959 | 3.90 | 336 | 0 | 7 |
| Glutamine | 1217 | 4.01 | 323 | 10 | 56 |
| Phenylalanine | 1375 | 4.04 | 336 | 0 | 40 |
| Malic acid | 558 | 2.89 | 380 | 7 | 937 |
| Citric acid | 533 | 2.86 | 236 | 13 | 1056 |
| Oxalic acid | 375 | 2.36 | 234 | 24 | 1082 |
| Malonic acid | 433 | 2.65 | 286 | 8 | 1138 |
| 2,6-PCA | 696 | 2.42 | 249 | 23 | 1116 |
| 2,6-PCA | 696 | 2.45 | 269 | 10 | 929 |
| Succinic acid | 492 | 3.21 | 390 | 20 | 1063 |
| Anthranilic acid | 1142 | 3.59 | 326 | 13 | 186 |
| Pyrrole-2-CA | 924 | 3.14 | 334 | 8 | 976 |

In addition, the first two polishing compositions in Table 16 were evaluated for PETEOS silicon dioxide removal, silane silicon dioxide removal, and silicon nitride removal under the same polishing conditions used to obtain the data for Table 16. The results are shown in Table 17. In Table 16, "2,6-PCA" refers to 2,6-pyridine dicarboxylic acid, and "Pyrrole-2-CA" refers to pyrrole-2-carboxylic acid.

TABLE 17

Removal Rates for Silicon Carbide and Silicon Nitride versus Silicon Dioxide

| Composition | PETEOS RR (Å/min) | Silane SiO$_2$ RR (Å/min) | Silicon Nitride RR (Å/min) |
| --- | --- | --- | --- |
| Acetic acid | 22 | 545 | 470 |
| Glycine | 15 | 15 | 435 |

The results in Table 17 demonstrate a high selectivity for silicon nitride removal versus PETEOS silicon oxide removal for both slurries, and a selectivity for silicon nitride removal versus silane-derived silicon dioxide for the slurry containing glycine as the buffering agent.

To further evaluate the silicon nitride and silicon carbide selectivities relative to PETEOS and silane-derived silicon The results in Table 18 surprisingly demonstrate that selectivity for removal of silicon carbide and silicon nitride over the softer silane-derived silica can be achieved even with a non-amino acid containing slurry by reducing the slurry concentration and/or increasing the pH above 3.5, while still maintaining good overall removal rates for silicon carbide and silicon nitride.

All references, including publications, patent applications, and patents, cited herein are hereby incorporated by reference to the same extent as if each reference were individually and specifically indicated to be incorporated by reference and were set forth in its entirety herein.

The use of the terms "a" and "an" and "the" and similar referents in the context of describing the invention (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the invention and does not pose a limitation on the scope of the invention unless otherwise claimed. No language in the specification should be construed as indicating any non-claimed element as essential to the practice of the invention.

Preferred embodiments of this invention are described herein, including the best mode known to the inventors for carrying out the invention. Variations of those preferred embodiments may become apparent to those of ordinary skill in the art upon reading the foregoing description. The inventors expect skilled artisans to employ such variations as appropriate, and the inventors intend for the invention to be practiced otherwise than as specifically described herein. Accordingly, this invention includes all modifications and equivalents of the subject matter recited in the claims appended hereto as permitted by applicable law. Moreover, any combination of the above-described elements in all possible variations thereof is encompassed by the invention unless otherwise indicated herein or otherwise clearly contradicted by context.

What is claimed is:

1. A chemical-mechanical polishing (CMP) method for selectively removing silicon carbide from the surface of substrate in preference to silicon dioxide, the method comprising the steps of:
   (a) contacting a surface of the substrate with a polishing pad and an aqueous CMP composition; and
   (b) causing relative motion between the substrate and the polishing pad while maintaining a portion of the aqueous CMP composition in contact with the surface between the pad and the substrate for a period of time sufficient to abrade at least a portion of the silicon carbide present in the substrate from the surface;
   wherein the aqueous CMP composition contains a particulate alumina-doped colloidal silica abrasive present at a concentration in the range of about 0.1 to about 5 percent by weight, wherein the particulate alumina-doped colloidal silica abrasive is about 600 to about 800 ppm of aluminum based on the particulate weight, and an acidic buffering agent providing a pH in the range of about 2 to about 7, the aqueous CMP composition being capable of abrading silicon carbide present on the surface of the substrate at a higher removal rate than the concurrent abrading of silicon dioxide present on the surface of the substrate.

2. The method of claim 1 wherein the acidic buffering agent comprises an organic acid.

3. The method of claim 2 wherein the organic acid comprises a carboxylic acid, a phosphonic acid, or a combination thereof.

4. The method of claim 2 wherein the organic acid comprises acetic acid.

5. The method of claim 2 wherein the organic acid comprises 1-hydroxyethylidene-1,1-diphosphonic acid.

6. The method of claim 2 wherein the organic acid comprises an amino acid.

7. The method of claim 1 wherein the aqueous CMP composition comprises less than about 0.5 percent by weight of organic materials.

8. The method of claim 1 wherein the acidic buffering agent comprises an inorganic acid.

9. The method of claim 1 wherein the acidic buffering agent comprises a phosphoric acid.

10. The method of claim 1 wherein the particulate alumina-doped colloidal silica abrasive is present at a concentration in the range of about 0.1 to about 2 percent by weight.

11. The method of claim 1 wherein the particulate alumina-doped colloidal silica abrasive comprises alumina-doped colloidal silica having a mean particle size in the range of about 40 to about 150 nm.

12. The method of claim 1 wherein the particulate alumina-doped colloidal silica abrasive has a mean particle size in the range of about 20 nanometers to about 150 nanometers.

13. The method of claim 1 wherein the particulate alumina-doped colloidal silica abrasive has a mean particle size in the range of about 40 nanometers to about 50 nanometers.

14. The method of claim 1 wherein the particulate alumina-doped colloidal silica abrasive has a mean particle size in the range of about 40 nanometers to about 150 nanometers.

15. The method of claim 1 wherein the acidic buffering agent provides a pH in the range of about 2 to about 5.

16. The method of claim 1 wherein the pH of the aqueous CMP composition is in the range of about 3.5 to about 7.

17. A chemical-mechanical polishing (CMP) method for selectively removing silicon carbide from the surface of a substrate in preference to silicon dioxide, the method comprising the steps of:
   (a) contacting a surface of the substrate with a polishing pad and an aqueous CMP composition; and
   (b) causing relative motion between the substrate and the polishing pad while maintaining a portion of the aqueous CMP composition in contact with the surface between the pad and the substrate for a period of time sufficient to abrade at least a portion of the silicon carbide present in the substrate from the surface;
   wherein the aqueous CMP composition contains about 0.1 to about 1 percent by weight of particulate alumina-doped colloidal silica having a mean particle size in the range of about 40 to about 150 nanometers, and wherein the particulate alumina-doped colloidal silica abrasive is about 600 to about 800 ppm of aluminum based on the particulate weight, and a buffering agent comprising an organic acid, the buffering agent providing a pH in the range of about 2 to about 5; the aqueous CMP composition being capable of abrading silicon carbide present on the surface of the substrate at a higher removal rate than the concurrent abrading of silicon dioxide present on the surface of the substrate.

18. The method of claim 17 wherein the organic acid comprises a carboxylic acid, a phosphonic acid, or a combination thereof.

19. The method of claim 17 wherein the organic acid comprises a carboxylic acid.

20. The method of claim 19 wherein the carboxylic acid comprises an amino acid.

21. The method of claim 20 wherein the amino acid comprises glycine.

22. The method of claim 17 wherein the organic acid comprises a phosphonic acid.

23. The method of claim 17 wherein the aqueous CMP composition comprises less than about 0.5 percent by weight of organic materials.

24. The method of claim 17 wherein the pH of the aqueous CMP composition is in the range of about 3.5 to about 7.

* * * * *